US005740260A

United States Patent [19]

Odom

[11] Patent Number: 5,740,260

[45] Date of Patent: Apr. 14, 1998

[54] MIDI TO ANALOG SOUND PROCESSOR INTERFACE

[75] Inventor: Leo J. Odom, Baton Rouge, La.

[73] Assignee: Presonus L.L.P., Baton Rouge, La.

[21] Appl. No.: 445,688

[22] Filed: May 22, 1995

[51] Int. Cl.$^6$ .............................. H04B 1/00; G01D 5/00; H03G 5/00

[52] U.S. Cl. .......................... 381/119; 381/101; 381/103; 381/118

[58] Field of Search .................................... 381/119, 101, 381/102, 103, 118; 84/645

[56] References Cited

U.S. PATENT DOCUMENTS

| | | | |
|---|---|---|---|
| 4,375,776 | 3/1983 | Okamoto | 84/345 |
| 4,677,674 | 6/1987 | Snyder | 381/58 |
| 4,781,097 | 11/1988 | Uchiyama et al. | 84/1.13 |
| 4,993,073 | 2/1991 | Sparkes | 381/119 |
| 5,054,077 | 10/1991 | Suzuki | 381/109 |
| 5,060,272 | 10/1991 | Suzuki | 381/119 |
| 5,138,926 | 8/1992 | Stier et al. | 84/615 |
| 5,206,913 | 4/1993 | Sims | 381/103 |
| 5,208,421 | 5/1993 | Lisle et al. | 84/645 |
| 5,212,733 | 5/1993 | Devitt et al. | 381/119 |
| 5,227,573 | 7/1993 | Nakano | 84/622 |
| 5,260,508 | 11/1993 | Bruti et al. | 84/622 |
| 5,291,558 | 3/1994 | Ross | 381/107 |

OTHER PUBLICATIONS

That Analog Engine™ IC Dynamics Processor, Specifications[1,2], That Corporation (Sep. 30, 1993) pp. 1–8.

Eargle, John, Sound Recording 2d Ed., © 1980 by Litton Educational Publishing, Inc., pp. 239–244.

Tutorial on MIDI and Music Synthesis, MIDI and Wavetable Synthesis Tutorial, pp. 1–22.

MIDI 1.0 Detailed Specification, Document Version 4.2 Oct. 94, pp. 1–57.

Lancaster, CMOS Cookbook, 1979, pp. 355–356.

*Primary Examiner*—Forester W. Isen
*Attorney, Agent, or Firm*—Pravel, Hewitt, Kimball & Krieger

[57] ABSTRACT

An apparatus for automatically recalling audio parameter setup is disclosed. A processor is coupled between a MIDI interface and one or more analog level controlled audio processor channels. The setup parameters, previously entered and stored by the composer in a host computer, are transmitted via the MIDI interface to the processor. The parameters are subsequently converted into an analog signal by a converter. The analog signal is provided to a parameter conversion array which converts the analog signal based on a transformation function. The outputs from the parameter conversion array are provided to one or more analog multiplexers. The outputs of the multiplexers are provided to the control inputs of the analog signal processing channels. Each control input of each analog signal processing channel includes a small capacitor, which in combination with an operational amplifier, forms a sample-and-hold circuit to temporarily store the analog output for the analog processor channels.

During operation, the processor repeatedly scans all channels and provides all parameters for each channel within an allocated time frame. The overall scan rate is fast enough so that the droop in each control input of each analog signal processing channels, as maintained by the small capacitor in the sample-and-hold device, is within one bit resolution of the converter.

20 Claims, 3 Drawing Sheets

MIDI TO ANALOG SOUND PROCESSOR INTERFACE

SPECIFICATION

BACKGROUND OF THE INVENTION

1. Field of the Invention

The present invention relates generally to electronic musical instruments and more particularly, relates to an apparatus for automatically recalling audio parameter setups for music instruments.

2. Description of the Related Art

The application of electronic technology to the production of music has been around as long as electronic technology itself. As vacuum-tubes, transistors and eventually microprocessors became cost effective for audio applications, musicians and manufacturers quickly applied the technology. During the early days, analog amplifiers and synthesizers were large, expensive to build and maintain, and difficult to operate. Advances in electronic technology eventually shrank the size of the analog audio electronics and improved the reliability while providing relatively high quality sounds. When low-cost microprocessors and integrated circuits began to appear, music equipment manufacturers eagerly adopted digital technology in their designs to provide "smarter" and more flexible music instruments.

The evolution of the Musical Instrument Digital Interface, commonly known as MIDI, epitomized the success of the application of digital technology to the music world. The advent of MIDI has provided musicians the sophisticated resources that were once available only to large recording studios with teams of musicians and technicians. With MIDI, a musician can play a single keyboard and simultaneously trigger a number of synthesizers to generate high fidelity sounds representative of guitars, woodwind instruments, and even acoustic voice, among others. The basis for such powerful recreation of sounds using MIDI is the MIDI protocol for sending digital representations of sound information over serial lines between the equipment and electronic musical instruments.

Under MIDI, a number of instructions control the operation of the synthesizers. Each synthesizer typically contains a processor with information required to generate a plurality of sound patterns. For example, the MIDI instructions can cause the synthesizer to produce a certain pitch at the speaker.

The MIDI instructions may be created by manually playing the keys of particular instruments and recording the sequence of keyboard activation into memory or disk storage for subsequent replay. In effect, the musician's gestures made on a keyboard are translated into MIDI instructions, sent out of the MIDI Out port of the keyboard, and received at the MIDI In port of a second (and third, and fourth, ad infinitum) instrument, and each instrument faithfully reproduces those gestures. Alternatively, the instructions can be created using a sequencing program on a computer, which is quite powerful because it is similar to having a multi-track recording studio on a computer. The sequencer "records" digital data, which can then be "played back" on request.

Because MIDI data can be saved into a storage device, the composer can display and manipulate the data, much as a writer manipulates written text with a word processor. Each track can be recorded or overdubbed in synchronization. The composer can transpose sequences in pitch, velocity, or duration, shift them in time, or invert sequences after recording. A composer can edit note by note, rearrange passages using cut and paste functions, and easily fix any mistakes that occurred while recording. Any particular sound pitch also can be changed, either entirely or by just one parameter, such as a "decay" parameter. The ability to create a MIDI file therefore presents many advantages for a music composer. The composer easily can change key and tempo, and effortlessly experiment with tone color. In addition, because sequences are called up and reiterated easily, the composer can explore the formal dimensions of music. The composer can restructure an entire work with little difficulty. With such flexibility, MIDI has been accepted enthusiastically by the music industry.

Although in general digital technology has accounted for a significant portion of the music equipment market, analog equipment is still utilized for many reasons. Many analog synthesizers remain popular and in widespread use because people like their sounds and have learned the techniques for programming them. In many situations, the processing of audio signals in the analog domain remains the most cost effective and provides the best audio quality and clarity. For instance, although digital signal processing technology can be used, analog signal processors are more effective in equipment such as audio compressors, limiters, gates, expanders, deessers, duckers, noise reduction systems, and the like. Further, analog amplifiers remain the dominant technology for amplifying vocal renditions of songs or speech due to the simplicity of operation and the low cost. Finally, in certain high power, high fidelity audio systems, analog technology is often the only alternative available. For these reasons, analog equipment has not been eradicated from the music industry and in fact, provides a vibrant and complementary technology to digital music equipment.

In contrast to the ease of recalling and modifying the prior setups and equipment configuration in MIDI instruments, analog instruments such as amplifiers, processors and synthesizers are notoriously difficult to set up and operate. The art of "programming" these analog amplifiers, processors and synthesizers involves using patch cables to make temporary electrical connections among various components such as filters and oscillators. Thus, a common sight at auditoriums or concert halls is a wall of amplifiers and synthesizers, each with its own tangle of patch cables and a bewildering array of buttons, switches, and sliders.

Because mobility is a requirement facing many audio systems serving bands or speakers on a tour schedule, a need exists for rapidly repatching the music equipment and recalling their parameter settings. Although most digital music equipment incorporates the ability to save the settings, analog equipment cannot store the parameters. Further, because the digital and analog equipment need to be tuned relative to each other, a need exists to conveniently store the adjustment parameters for the outputs of these devices so that they can be further synchronized. Thus, the ability to recall previous parameter settings is important in many situations encountered in small or large recording studios, public address systems, or other environments where it is necessary to recall audio parameter setups such as volume, mute, compression, noise gating, or equalization, among others.

The adjustments of the setup parameters have traditionally been performed manually. As a result, unproductive time is spent adjusting and tuning the equipment by changing the setup parameters. Further, because the manual approach requires that the parameter settings be laboriously recorded and updated at every event, an error in recording or reapplying the parameters to the equipment may lead to variability in the sound output. Thus, a need exists for a convenient way to save and reapply the previously saved setup parameters for the musical equipment. Additionally, for a number of reasons, including the need to periodically retune these analog systems to compensate for drift problems due to heating effects, a need exists for a real time update and control of the analog audio equipment.

SUMMARY OF THE INVENTION

The ease of setup parameter storage and recall is accomplished in the present invention by using a host MIDI system to store and transmit the data and reconverting the digitally stored data into their analog equivalents to be presented to the analog audio processors.

The invention provides a digital processor which interfaces with a MIDI port and a plurality of analog level controlled audio processor channels. The setup parameters, previously entered and stored by the composer in a host computer, are transmitted via the MIDI communications protocol to the processor of the present invention. Upon receipt of the setup parameters, the processor stores the parameters into its internal memory and provides these parameters to a digital to analog converter (DAC) which converts the digital data into an analog signal.

The output of the DAC is provided to a plurality of analog parameter conversion circuits, each of which converts the linear output of the DAC using the applicable function for that parameter. The parameter conversion includes signal level shifting, log conversion, and other functions to achieve compression, volume control, and noise handling.

The output of the analog parameter conversion circuit is provided to a plurality of analog multiplexers whose selection function is controlled by the processor. The outputs of the plurality of multiplexers are provided to the control inputs of a plurality of analog signal processing channels. Each control input of the analog signal processing channels includes a small capacitor which, in combination with an operational amplifier at the input, forms a sample-and-hold device to temporarily store the analog output from its corresponding multiplexer output.

During operation, the processor repeatedly scans all channels and provides all parameters for each channel within an allocated period. The overall scan rate is fast enough so that the droop in the control input of each analog signal processing channel, as maintained by the small capacitor in the sample-and-hold device, is within one bit resolution of the DAC.

The parameter stored by each sample-and-hold device is presented as an input to the analog audio signal processer, which processes the audio input signal in accordance with the parameters presented to the analog processor.

As can be seen, the present invention extends the ability of MIDI systems to digitally store and recall the audio setup parameters so that analog audio equipment can be tuned quickly and accurately. Further, the system also facilitates real time control over any parameter via the MIDI interface, thus making real time automation possible by synchronizing control from an external event recorded by a digital sequencer or changed manually by a performer using a foot pedal or a remote-control device.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Figure 1:
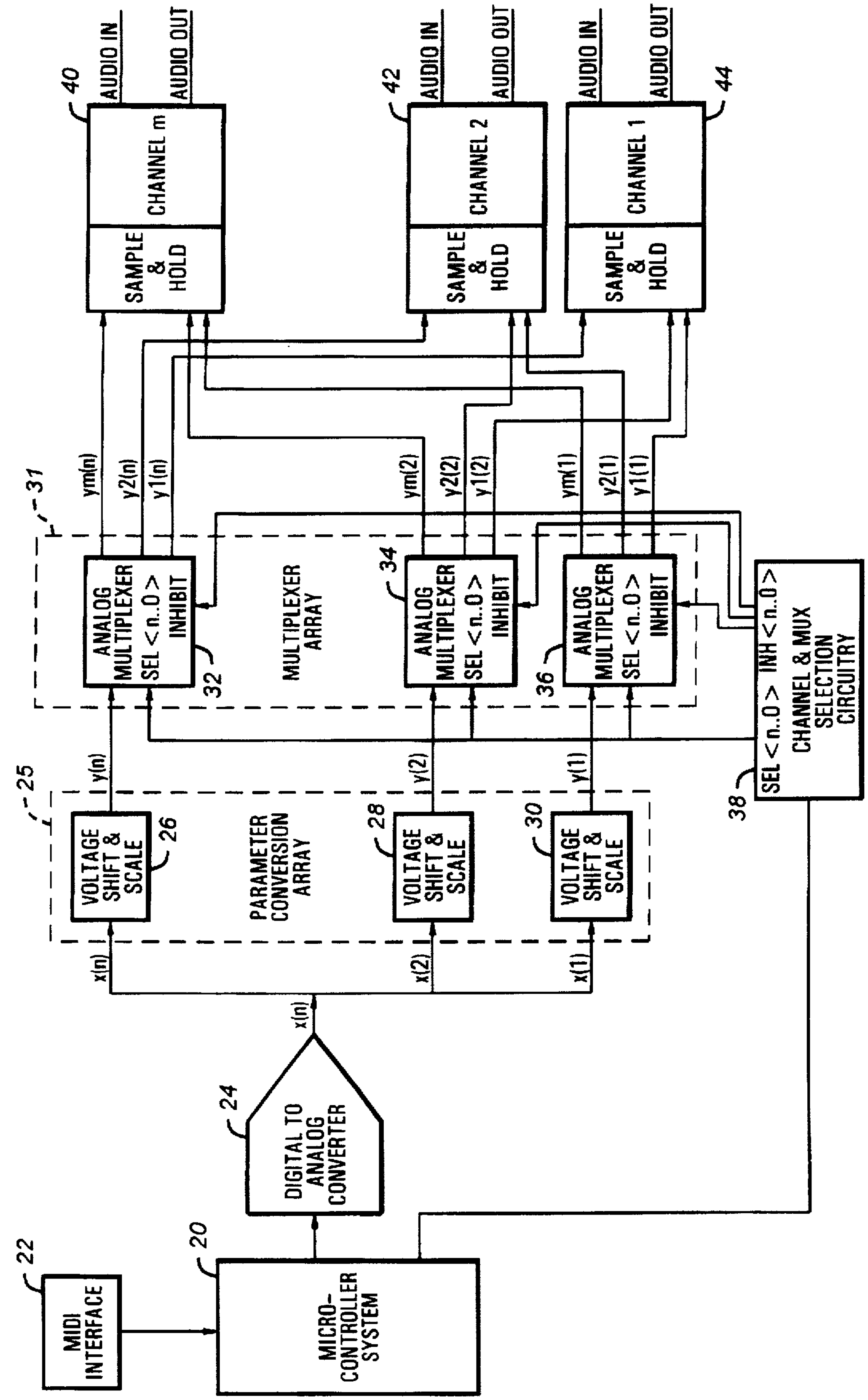
FIG. 1 is a block diagram of the MIDI to analog sound processor interface of the present invention.

Turning now to FIG. 1, a block diagram of the MIDI to analog sound processor interface of the present invention is disclosed. As shown in FIG. 1, a microcontroller system 20 interfaces between a MIDI interface 22, a control panel (not shown), and a plurality of analog level controlled audio processor channels 40, 42 and 44. The control panel is a keyboard through which the composer can issue commands to directly control the microcontroller system 20. Once the audio setup parameter data has been received from the MIDI interface 22, the microcontroller system 20 stores the data, responds to all input from the control panel, and then processes the data for each parameter of each audio channel.

In the system shown in FIG. 1, the audio setup parameters, which were previously entered by the composer into a host computer, are downloaded to the microcontroller system 20 via the MIDI interface 22, which includes the conventional line drivers, opto-isolators and limiting and pull-up resistors as standard for MIDI.

The MIDI software protocol accomplishes the data transfer. In the protocol, each of the different numbered sequences in the MIDI data format specification is called a MIDI message. Each message describes a particular event—the start of a musical note, the change in a switch setting, the motion of a foot pedal, or the selection of a sound patch, for example. Each MIDI message is made up of an eight bit status byte which is generally followed by one or two data bytes. At the highest level, MIDI messages are classified as either channel messages or system messages. Channel messages are those which apply to a specific channel and a channel number is included in the status byte for these messages. Channel messages may be further classified as being either channel voice messages, or mode messages. Channel voice messages carry musical performance data, and these messages comprise most of the traffic in a typical MIDI data stream. Further details can be obtained by reviewing a MIDI specification or text.

In the present invention, a host MIDI computer system sends audio parameter setup data via the MIDI interface 22 using program change messages, which are a member of the channel voice messages. In the MIDI context, the program change messages are used to specify the type of instrument which should be used to play sounds on a given channel. A program change message has only one status byte and one data byte which selects a patch on the device receiving the message. Upon receipt of a program change message, the microcontroller 20 calls up the patch corresponding to the patch value in the message. Thus, the appropriate setup data is loaded into an array in the microcontroller's memory for subsequent signal processing.

In the preferred embodiment, five parameters are stored by the microcontroller system 20 in the microcontroller's storage locations that are used to store each audio scene. Each scene is equal to thirty-two 16-bit digital values. The audio setup parameters received by the microcontroller system 20 in the preferred embodiment include signal compression, compression ratio, dynamic noise gating, and volume/muting parameters. Additional or different parameters could be received and utilized according to the present invention. From these five parameters, the microcontroller system 20 controls each of the analog signal processor channels. The microcontroller system 20 loads and stores all audio scenes as a program. Each program can be instantly recalled or loaded via the MIDI interface 22 using the MIDI program change command as discussed above, or via the control panel using the load command. Further, all parameters for each channel within each program can be changed through the MIDI interface 22 using continuous controller values or via the control panel by preselecting the parameter directly. In the MIDI context, continuous controllers can transmit a large block of control data over a range of values, normally 0 to 127 using the MIDI control change message.

Once the parameters have been received, the microcontroller system 20 provides the memory array storing the audio setup parameter, as referenced by the current program, to a digital analog converter (DAC) 24. The DAC 24 converts the digital values from the data bus of the microcontroller 20 into the analog domain. In the preferred embodiment, a twelve bit DAC device is utilized, although a number of other conveniently sized output bus width may be used.

The output of the DAC 24 is presented to a parameter conversion array 25, further comprising a plurality of voltage shift and scale blocks 26, 28 and 30. Each voltage shift and scale block in the parameter conversion array 25 converts the linear output of the DAC 24 for each parameter using a number of functions known in the art such as signal scaling, offset shifting, log conversion, among others. The parameter processing of the linear data is necessary to utilize the full range of the DAC 24 so that the maximum resolution is maintained relative to the number of bits of the DAC. In the preferred embodiment, each of the voltage shift and scale blocks 26, 28 and 30 comprises an operational amplifier which performs the signal shifting and scaling function.

The output from parameter conversion array 25 is presented to a multiplexer array 31 which is configured to demultiplex the analog signals and provide them to a plurality of audio processing channels 40, 42 and 44. The multiplexer array 31 comprises a plurality of analog multiplexer devices 32, 34 and 36 which are selected by the microcontroller 20 via the channel and mux selection circuitry 38. The channel and mux selection circuitry 38 has a plurality of inhibit outputs, each connected to a multiplexer device, and a plurality of selection (SEL) signals that are common to all multiplexer devices. Each of the analog multiplexers 32, 34 and 36 has an inhibit input which, upon being asserted, places the output of the multiplexer device into a high impedance mode.

The demultiplexed analog outputs from the multiplexer array 31 are then presented to a plurality of audio signal processing channels 40, 42, and 44. Each of these audio signal processing channels has a number of discrete parameters which are sampled and stored in a sample-and-hold circuit at the front end of each input of each channel.

Figure 1A:
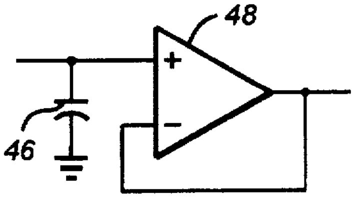
FIG. 1A is a schematic of the sample-and-hold circuit of an audio signal processing channel of FIG. 1.

The details of the sample and hold circuit are disclosed in FIG. 1A. As can be seen in FIG. 1A, the sample-and-hold device contained in each of channels 40, 42 and 44 is configured in the usual manner and has a capacitor 46 on the non-inverting input of an operational amplifier 48. The output of the operational amplifier 48 is looped back to the inverting input of the operational amplifier 48 to form a unity gain or buffer configuration. In this manner, when the output of each multiplexer goes into a high impedance state when the multiplexer is deselected, the storage capacity of the capacitor 46 in conjunction with the high input impedance of the operational amplifier 48 functions as a sample-and-hold device to temporarily save the analog signal input. As mentioned earlier, the microcontroller 20 scans each of channels 40, 42 and 44 at an overall scan rate sufficiently fast so that the droop in each control input of each analog signal processing channels, as maintained by the capacitor 46, is within one bit resolution of the DAC 24.

During operation, the microcontroller 20 arbitrates control between the MIDI interface 22 and the control panel and gives priority to the control panel in case of simultaneous requests. An operation control cycle starts with the microcontroller 20 providing the first parameter of the first channel to the DAC 24. The first multiplexer 32 is then selected and provides an analog output to the first parameter control input of the first audio processing channel 40. The other multiplexers are inhibited. Next, the second parameter of the first channel is provided to the DAC 24 and the second multiplexer 34 is selected and provides an analog output to the second parameter control input of the first audio channel 40. All other multiplexers are inhibited. This process continues until all parameters for all channels have been provided.

The parameters are then presented to an analog signal processor (not shown) in each channel to further process the audio input that is presented to each of the audio signal processing channels 40, 42 and 44. In the preferred embodiment, the analog signal processor performs signal compression, compression ratio, signal muting, signal volume, and dynamic noise gating.

The signal compression performed by the analog processor extends the dynamic range of the audio input to the channel by keeping the weakest parts of the audio input above the noise level and the strongest parts of the audio input from saturating the devices receiving the audio output. Compression is useful in electronic music production in many ways. For example, the use of a compressor for recording natural sounds for processing (filtering, modulating, and so on) can smooth out variations in amplitude that the composer might find undesirable. In addition, compressors are also used for works involving real time electrical acoustical modification of instrument sounds when it is important to have a constant level for processing. In recording, compressors have many uses such as smoothing out the variation caused by a vocalist who tends to move forward and away from a microphone. This movement produces a signal with wide variations and levels which can be eliminated by a properly adjusted compressor. Additionally, the dynamic characteristics of the compressor itself are often used purposefully to impart different attack-and-decay characteristics of the sounds. For example, in commercial recordings, compression can be used to impart a "punchier" sound to a bass.

In the preferred embodiment, compression is performed using a feed forward automatic gain control topology. The analog signal processor also provides a threshold adjustment to the compression which allows the operator to select the program level at which compression action begins. The compression ratio is implemented as the ratio of gain reduction of the input signal to output signal. Thus, the amount of compression is measured numerically in terms of the input:output level. For example, if the ratio is set at 2:1, for every 1 dB increase in signal at the input, the output is decreased by (1½)dB, or 0.5 dB. If the compression ratio is set at 4:1, the output is decreased by (1¼)dB, or 0.75 dB, for a 1 dB increase at the input. In the preferred embodiment, the range of compression ratio is 1:1 to 25:1. At 25:1, the compression ratio is considered to be infinity to 1 ((1¹⁄₂₅)dB or 0.96 dB decrease for a 1 dB increase) for all practical purposes. For any increase in signal amplitude at the input, there is no increase to the amplitude at the output. This process also known as limiting the signal. In the preferred embodiment, a two quadrant analog multiplier is used to convert the incoming analog control voltage to a voltage controlled ratiometric device. As can be seen, the analog processor compresses and limits the audio input to automatically adjust a wide dynamic range input signal to fit for a transmission or storage medium of lesser dynamic range.

The analog processor also performs the noise gating function, as controlled by one of the parameters downloaded from the MIDI interface 22. The analog processor implements a noise gate, which is a device that behaves like a unity-gain amplifier in the presence of the desired sounds, or program, and causes gain reduction in the absence of the desired program. In the preferred embodiment, the dynamic noise gate is implemented as a threshold of the gating function. This threshold is used as a point at which the output is attenuated by at least 80 dB. Any signal at the audio input of the channel that is of lower amplitude then the threshold is reduced 80 dB at the output and gating out those control signals below the threshold.

The analog processor can adjust the volume and muting function to synchronize its output level with the outputs of other analog processors. The volume and muting function is accomplished by controlling a voltage controlled amplifier directly with the analog control signal for the volume and muting function. The greater the control voltage, the louder the audio output. When the control voltage for the voltage controlled amplifier is grounded, the audio output is muted.

These are exemplary parameters or functions of the preferred audio signal processor, but it is understood that other parameters could be provided and the audio signal processor could perform other functions.

As discussed above, each audio signal processing channel requires a number of parameters to be provided to it. Although the parameters may be manually provided using potentiometers and other manual input devices, such parameter setups are labor intensive and error-prone. The present invention provides for an automatic setup parameter recall and update of the audio signal processing channels by receiving the setup data using the MIDI protocol and converting the digital data into an analog signal before applying the signal to the analog audio processors.

Figure 2:
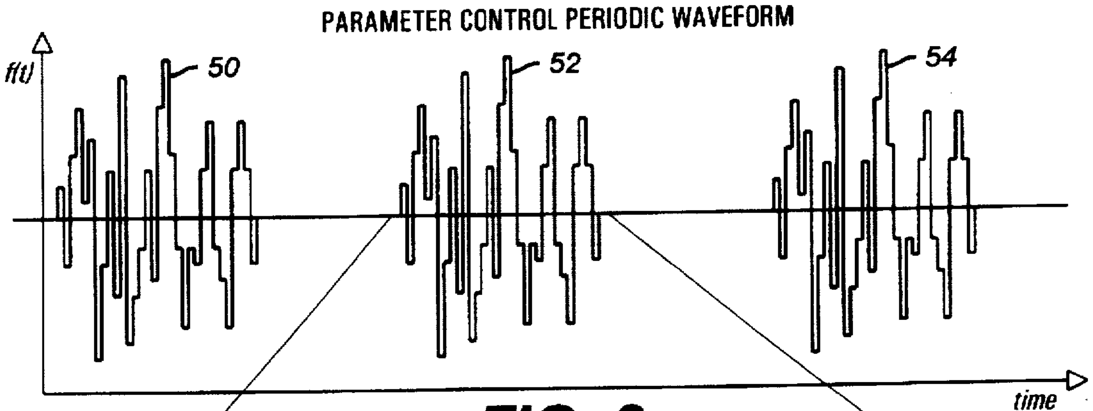
FIG. 2 is a plot of the parameter control periodic waveform of the parameter conversion circuit of FIG. 1.

Turning now to FIG. 2, a frequency versus time plot of the parameter control periodic waveform is disclosed. As shown in FIG. 2, a plurality of parameter control waveforms 50, 52 and 54 appear periodically. The period of these waveforms depends on the number of channels, the number of parameters in each channels, and the resolution of the DAC 24. The greater the channels and the greater the number of parameters associated with each channel, the longer it takes to transmit all information and thus the period for each parameter control waveform increases. However, as discussed earlier, the duration of the parameter control waveform is tempered by the microcontroller's need for scanning each of channels 40, 42 and 44 at an overall scan rate sufficiently fast so that the droop in each control input of each analog signal processing channels, as maintained by the capacitor 46, is within one bit resolution of the DAC 24.

Figure 3:
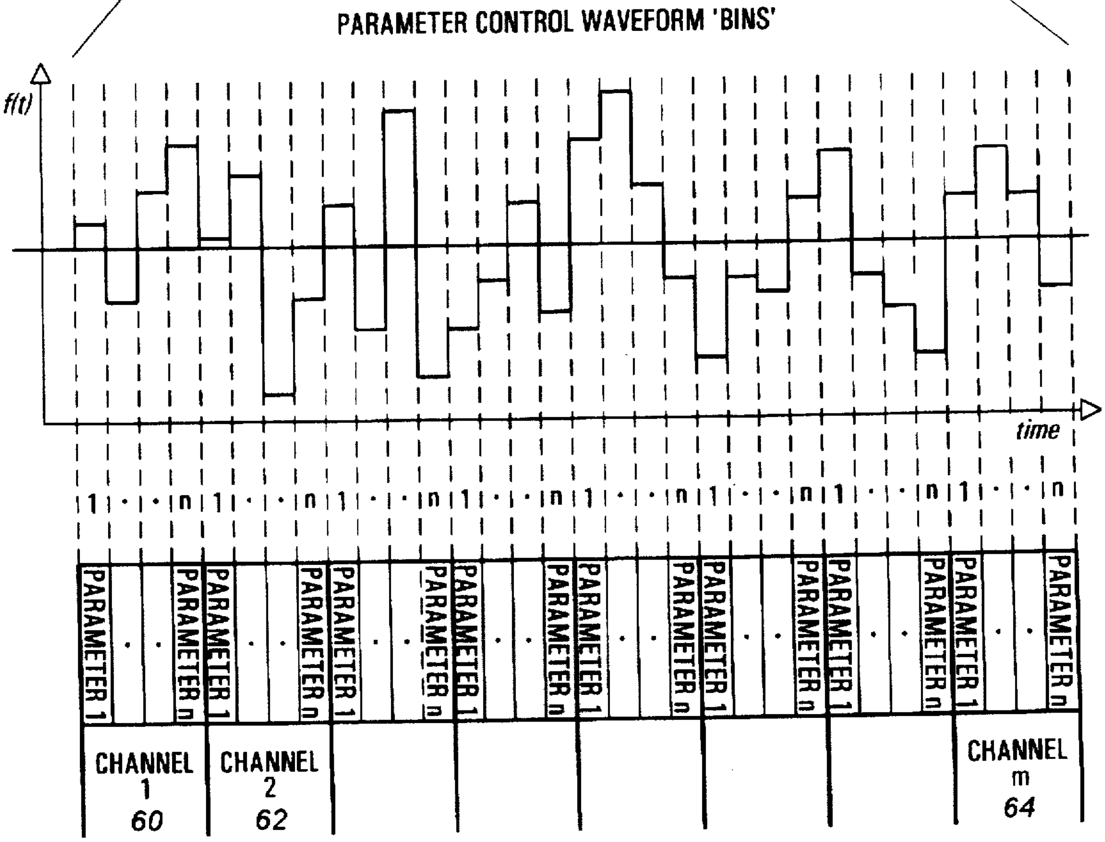
FIG. 3 is an expanded plot of FIG. 2 showing the parameter control waveform 'bins' processed by the parameter conversion circuit of FIG. 1.

Turning now to FIG. 3, the details of a control parameter waveform is disclosed in greater detail. FIG. 3 is an expanded view of waveform 52 of FIG. 2. As shown in FIG. 3, a number of bins are disclosed for grouping the parameters of a given channel together in time sequence. Thus, bin 60 contains parameter 1 through parameter n for the audio signal processing channel 1. Next, bin 62 contains parameter 1 through parameter n for the audio signal processing channel 2. This process is repeated until the last audio signal processing channel m, for which bin 64 contains parameter 1 through parameter n. As can be seen, FIG. 3 illustrates in greater detail the relationship of the number of channels m, the number of parameters n in determining the duration of each parameter control waveform.

Figure 4:
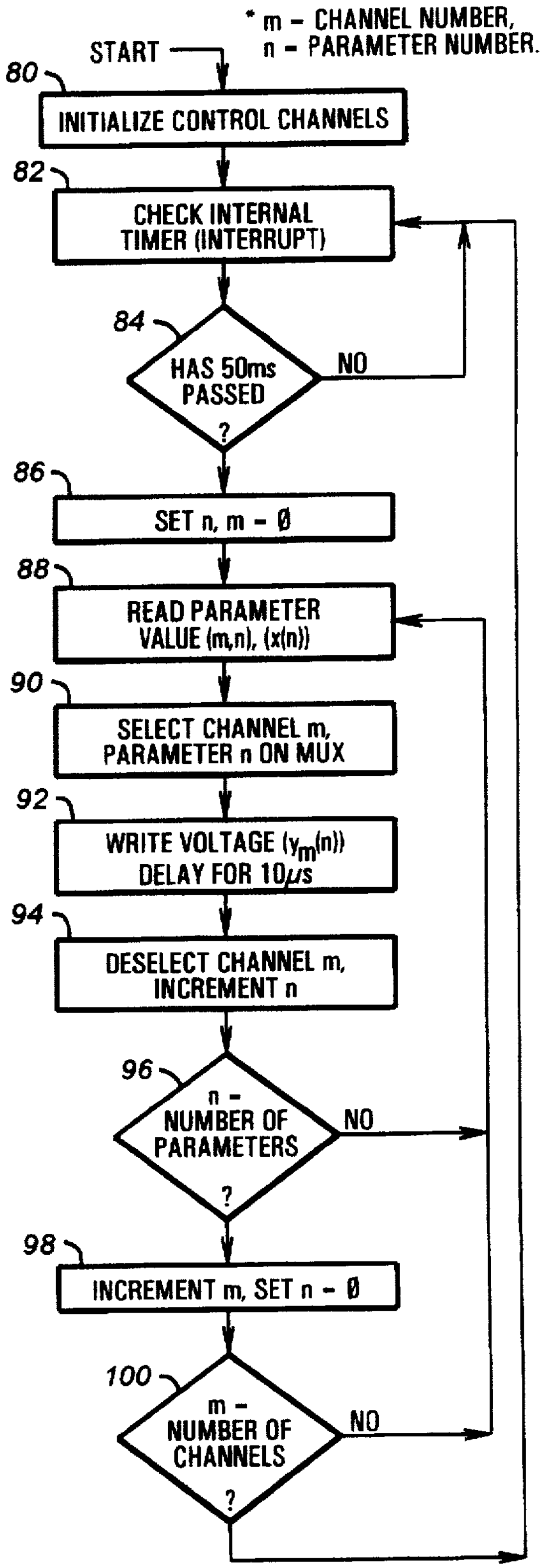
FIG. 4 is a flowchart illustrating the synthesis of the parameter control periodic waveform by the processor of FIG. 1.

Turning now to FIG. 4, the flow chart for synthesizing the parameter control periodic waveform is shown. In step 80, the microcontroller 20 initializes the control channels. In step 82, the microcontroller 20 checks its interrupt stack to see if a signal from an internal timer has been generated indicating the passage of a particular time period. In the preferred embodiment, the time window is 50 ms, although the window period can vary in accordance with the resolution of the DAC 24 and the droop rate of the capacitor 46. The microcontroller 20 verifies that the appropriate time window has passed, indicating that a new parameter control periodic waveform is to be generated in step 84. If not, the microcontroller merely loops back to check the interrupt from the internal timer in step 82.

If the time window has passed in step 84, the microcontroller 20 proceeds to generate the next parameter control waveform in step 86 by initializing the counters for n and m, representing the parameter count and the channel count, to zero.

Based on the current values of n and m, the microcontroller 20 indexes into the array containing the parameters its memory and retrieves the appropriate audio parameter setup value in step 88. In step 90, the microcontroller 20 selects the appropriate audio signal processing channel based on the value of m, and the appropriate multiplexer in the multiplexer array 31 based on the value of n, inhibiting the remaining multiplexers. Next, the microcontroller 20 instructs the DAC 24 to place the analog version of the stored parameter values onto the inputs of the parameter conversion array 25. Once the data has been converted and placed on the inputs to the parameter conversion array 25, with enough time allowed for DAC 24 operation and setting of the appropriate capacitor 46 at the output level of the DAC 24, the microcontroller 20 deselects the current audio channel and increments the counter for n in step 94. In step 96, if the counter for n is not equal to the number of parameters, the microcontroller 20 loops back to step 88 to complete the building of the bin for the current channel. If the number of parameters in a bin has been achieved in step 96, then the microcontroller 20 increments the channel counter for m and clears the counter for n to zero to indicate that a new bin reflecting a new channel be generated in step 98. In step 100, if the channel count to be processed is less than the maximum number of allocated channels, then the microcontroller 20 loops back to step 88 to continue building the parameter control waveform. However, if the channel counter m equals the number of allocated channels in step 100, then the microcontroller 20 has finished building one parameter control waveform and the microcontroller 20 returns to step 82 to build the another parameter control waveform.

As shown by FIG. 4, the duration of the parameter control waveform can grow as a function of the number of channels and the number of parameters in each channel, subject to the limitation that the microcontroller 20 needs to scan each of channels 40, 42 and 44 at an overall scan rate sufficiently fast so that the droop in each control input of each analog signal processing channels, as maintained by the capacitor 46, is within one bit resolution of the DAC 24.

As the MIDI system is effectively a local area network for musical instruments, a number of messages may be sent in real-time over the network. In the MIDI world, the instruments rely on synchronization to ensure that each device plays back stored materials at the same rate, from the same starting point. Each device is locked together in time, or synchronized, so that the entire ensemble of devices functions as a single system. In synchronization, one device functions as a master and the slave machines automatically and continuously match the timing of their recording or playback to the master's, establishing synchronism between devices. A number of synchronization methods known by those skilled in the art may be used, including using the MIDI clock, MIDI time code, MIDI beats since start (song position pointer), non-MIDI clock, or the SMPTE synchronization standard, among others. The automatic parameter recalling performed by the present invention can be made synchronous by interlocking the parameter updates of the analog processors in accordance with any of the methods known in the art. As such, the real time control over any parameter update can be accomplished via the MIDI interface.

As shown above, the present invention provides an apparatus for automatically recalling audio parameter setup via the MIDI protocol. By downloading the setup parameters previously entered and stored by the composer in a host computer to a microcontroller and converting the parameters into an analog signal that, after demultiplexing, could be presented as parameters to individual audio analog processors, the present invention extends the ability of MIDI systems to automatically set up the parameters of analog audio equipment. Further, the system also facilitates real time control over any parameter via the MIDI interface, thus making real time automation possible by synchronizing control from an external event recorded by a digital sequencer or changed manually by a performer using a foot pedal or a remote-control device.

The foregoing disclosure and description of the invention are illustrative and explanatory thereof, and various changes in the size, shape, materials, components, circuit elements, wiring connections and contacts, as well as in the details of the illustrated circuitry and construction and method of operation may be made without departing from the spirit of the invention.

What is claimed is:

1. An audio processing system for processing one or more audio inputs according to one or more parameters, the audio processing system receiving one or more signal processing parameters for one or more audio channels in a digital format and providing the processed version of the audio inputs as audio outputs, the audio processing system comprising:

a microprocessor for receiving, storing and outputting each of the one or more signal processing parameters for the one or more audio channels, the signal processing parameters being received, stored and output in a digital format;

a converter coupled to said microprocessor and receiving the digital output signal processing parameters, said converter converting each of said digital output signal processing parameters into respective analog parameter signals;

a plurality of parameter conversion circuits coupled to said converter, said parameter conversion circuits modifying each of said analog parameter signals as appropriate for each parameter;

analog signal processors, one analog signal processor for each of the audio channels, said analog signal processors coupled to said conversion circuits to receive said analog parameter signals for the respective audio channel, said analog signal processors processing the audio inputs in accordance with said analog parameter signals and providing the processed audio outputs; and each analog signal processor receiving a plurality of analog parameter signals generated by a corresponding plurality of said parameter conversion circuits.

2. The audio processing system of claim 1, further comprising:

a program code coupled to said processor for synthesizing periodic parameter control waveforms to said converter.

3. An audio processing system for processing one or more audio inputs according to one or more parameters, the audio processing system receiving one or more signal processing parameters for one or more audio channels in a digital format and providing the processed version of the audio inputs as audio outputs, the audio processing system comprising:

a microprocessor for receiving, storing and outputting each of the one or more signal processing parameters for the one or more audio channels, the signal processing parameters being received, stored and output in a digital format;

a converter coupled to said microprocessor and receiving the digital output signal processing parameters, said converter converting each of said digital output signal processing parameters into respective analog parameter signals;

analog signal processors, one analog signal processor for each of the audio channels, said analog signal processors coupled to said converter to receive said analog parameter signals for the respective audio channel, said analog signal processors processing the audio inputs in accordance with said analog parameter signals and providing the processed audio outputs;

a parameter conversion array coupled between said converter and said analog signal processors, said parameter conversion array modifying each of said analog parameter signals as appropriate for each parameter; and an analog multiplexer array coupled between said parameter conversion array and said analog signal processors, said analog multiplexer array coupling the modified analog parameter signals for each parameter to each of said analog signal processors.

4. The audio processing system of claim 1, further comprising:

an analog multiplexer array coupled between said converter and said analog signal processors, said analog multiplexer array coupling each of the respective analog parameter signals to each of said analog signal processors.

5. The audio processing system of claim 4, wherein said analog multiplexer array includes a multiplexer for each of said signal processing parameters, said multiplexer having an input coupled to said converter and outputs coupled to each of said analog signal processors.

6. The audio processing system of claim 4, further comprising:

a sample-and-hold device coupled between said multiplexer array and said analog signal processor for each analog signal processor input.

7. The audio processing system of claim 6, wherein each of said sample-and-hold devices includes an operational amplifier having an input and an output, said operational amplifier output being connected to said analog signal processor input, and a capacitor coupled to said input of said operational amplifier and to ground.

8. The audio system of claim 1, wherein said signal processing parameters are received by said microprocessor in a MIDI format.

9. The audio processing system of claim 1, wherein said analog parameter signals are generated in a time multiplexed format.

10. The audio processing system of claim 1, wherein the digital output signal processing parameters received by said converter and the respective analog parameters generated by said converter for each of said audio channels are grouped into a bin.

11. The audio processing system of claim 10, wherein each bin of parameters for each of said audio channels is sequentially generated in a time multiplexed format.

12. The audio processing system of claim 1, wherein said signal processing parameters are updated in real-time.

13. An audio processing system for processing one or more audio inputs according to one or more parameters, the audio processing system receiving one or more signal processing parameters for one or more audio channels in a digital format, the audio processing system having an analog signal processor in each audio channel for processing the audio inputs and providing the processed version of the audio inputs as audio outputs, the audio processing system comprising:

a microprocessor for receiving, storing and outputting each of the one or more signal processing parameters for one or more audio channels, the signal processing parameters being received, stored and output in a digital format;

a converter coupled to said microprocessor and receiving the digital output signal processing parameters, said converter converting each of said digital output signal processing parameters into a respective analog parameter;

a parameter conversion array coupled to said converter, said parameter conversion array modifying each of said analog parameter signal as appropriate for each parameter; and an analog multiplexer array coupled between said parameter conversion array and said analog signal processor in each audio channel, said analog multiplexer array coupling the modified analog parameter signals for each parameter to said analog signal processor of each audio channel.

14. The audio processing system of claim 13, further comprising:

a sample-and-hold device coupled between said multiplexer array and said analog signal processor for each analog signal processor input.

15. The audio processing system of claim 14, wherein each of said sample-and-hold devices includes an operational amplifier having an input and an output, said operational amplifier output being connected to said analog signal processor input, and a capacitor coupled to said input of said operational amplifier and to ground.

16. The audio system of claim 13, wherein said signal processing parameters are received by said microprocessor in a MIDI format.

17. The audio processing system of claim 13, wherein said analog parameter signals are generated in a time multiplexed format.

18. The audio processing system of claim 13, wherein the digital output signal processing parameters received by said converter and the respective analog parameters generated by said converter for each of said audio channels are grouped into a bin.

19. The audio processing system of claim 18, wherein each bin of parameters for each of said audio channels is sequentially generated in a time multiplexed format.

20. The audio processing system of claim 13, wherein said signal processing parameters are updated in real-time.

* * * * *